(12) United States Patent
Urano et al.

(10) Patent No.: US 7,872,877 B2
(45) Date of Patent: Jan. 18, 2011

(54) PLASMA DISPLAY APPARATUS

(75) Inventors: Osamu Urano, Kawasaki (JP); Kuninori Suzuki, Chigasaki (JP)

(73) Assignee: Fujitsu Hitachi Plasma Display Limited, Miyazaki-ken (JP)

( * ) Notice: Subject to any disclaimer, the term of this patent is extended or adjusted under 35 U.S.C. 154(b) by 1009 days.

(21) Appl. No.: 11/674,781

(22) Filed: Feb. 14, 2007

(65) Prior Publication Data

US 2007/0268213 A1 Nov. 22, 2007

(30) Foreign Application Priority Data

May 16, 2006 (JP) ............................. 2006-136000

(51) Int. Cl.
*H05K 7/02* (2006.01)
*H05K 7/04* (2006.01)
(52) U.S. Cl. ........................ 361/810; 361/807; 361/748
(58) Field of Classification Search ................ 361/600, 361/679.01, 679.27, 688–700, 704, 707, 361/717–719, 748, 801, 803, 807, 810; 349/56, 349/84, 139; 313/11, 46, 581–584
See application file for complete search history.

(56) References Cited

U.S. PATENT DOCUMENTS

| | | | | |
|---|---|---|---|---|
| 7,463,490 B2 * | 12/2008 | Kim et al. | ................... | 361/752 |
| 7,535,174 B2 * | 5/2009 | Shin | ............................ | 313/582 |
| 7,656,089 B2 * | 2/2010 | Mo et al. | ..................... | 313/582 |
| 7,660,105 B2 * | 2/2010 | Hwang | .................. | 361/679.27 |
| 2008/0297443 A1 * | 12/2008 | Arima et al. | .................. | 345/60 |
| 2009/0034179 A1 * | 2/2009 | Choi et al. | .................. | 361/681 |
| 2009/0135096 A1 * | 5/2009 | Jeong | .......................... | 345/60 |
| 2010/0134459 A1 * | 6/2010 | Kawada | ....................... | 345/211 |

FOREIGN PATENT DOCUMENTS

JP 2004-258473 9/2004

* cited by examiner

*Primary Examiner*—Hung S Bui
(74) *Attorney, Agent, or Firm*—Antonelli, Terry, Stout & Kraus, LLP.

(57) ABSTRACT

A PDP apparatus has a plurality of address driving modules (ADMs) connecting a PDP, a chassis, PDP address electrodes with an address driving circuit of the chassis side. The ADM has a flexible substrate on which wiring and a driver IC are mounted and an address substrate formed by a metal plate for holding/fixing the flexible substrate. With respect to a bracket of an attachment part of the chassis, the two adjacent ADMs are positioned by positioning pins and elongated holes at both ends of the address substrates, and attached and held/fixed by common fastening using a female screw portion, chipped portions, and a screw part. Reduction in the number of required parts and work man-hours, stable holding/fixing, etc. are realized in a driver module of a PDP apparatus.

10 Claims, 8 Drawing Sheets

PLASMA DISPLAY APPARATUS

CROSS-REFERENCE TO RELATED APPLICATION

The present application claims priority from Japanese Patent Application No. JP 2006-136000 filed on May 16, 2006, the content of which is hereby incorporated by reference into this application.

TECHNICAL FIELD OF THE INVENTION

The present invention relates to a technique for a plasma display apparatus (PDP apparatus) having a plasma display panel and particularly relates to the mounting structure such as a driver module and attachment thereof.

BACKGROUND OF THE INVENTION

In a conventional PDP apparatus (PDP module), in a basic constitution thereof, a PDP is pasted and fixed to a chassis by an adhesive layer, a circuit part (driving circuits), and so on for driving electrodes of the PDP are disposed on the rear side of the chassis. Electrode ends of the PDP and the driving circuits are electrically connected by using driver modules comprising, for example, flexible substrates (flexible printed circuit boards) and metal plates (also referred to as driver substrates).

As the driver module, particularly, an address driving module that connects an address driving circuit with address electrodes of the PDP is provided. The electrical connection made by the driver modules are designed separately in a plurality of driver modules corresponding to groups of the electrodes.

On the flexible substrate, wirings connecting the driving circuit side to the PDP electrode side, an IC, and so on are mounted. The flexible substrate is held and fixed in a curved form since it connects the end of the PDP side with the end of the driving circuit of the chassis side. The metal plate is bonded to the flexible substrate so as to hold and fix the flexible substrate relative to the chassis, etc. and is attached to the chassis structure by, for example, screwing. The metal plate is a member having functions/roles of, for example, holding and fixing the driver module and the flexible substrate, dissipating heat from an IC (semiconductor integrated circuit device), etc. of the flexible substrate, and grounding.

Examples of the constitution of a conventional driver module and the attachment part thereof related to the attachment of the above described chassis, the PDP, and the address driving modules include the following.

First, as a general configuration, at a metal plate constituting an address driving module and an attachment part (boss part or the like) corresponding thereto on a chassis structure, connection and fixing are made by screwing and fastening at two locations (vicinities of both ends) for one metal plate.

Secondly, there is a configuration in which screwing and a positioning pin are used in combination. For example, the technique described in Japanese Patent Application Laid-Open Publication No. 2004-258473 discloses a structure in which the position of one substrate of a driver module is fixed by fastening by screwing at one end thereof and by using a positioning pin at the other end thereof.

SUMMARY OF THE INVENTION

Regarding holding and fixing of a driver module and a flexible substrate in a PDP apparatus, the position thereof has to be determined with high precision and has to be stably held and fixed, particularly, in order to reduce stress to the flexible substrate. Particularly, there is a tendency that the number of electrodes and the number of driver modules are increased due to increased resolution of PDPs, and highly-precise and low-cost driver modules are required so as to deal with that.

In the above described first configuration of the conventional driver module, screwing is required for one metal plate at two locations at least, for example, in the vicinities of both ends thereof, for example, in an assembly step upon apparatus manufacturing. Therefore, there are following problems. First, there is a problem that, in relation to attachment of a plurality of driver modules to the chassis structure, many screw parts are required, and work man-hours becomes many or increased. Secondly, as a method and procedure of attachment of the driver module, one end side of the metal plate is screwed first, and the other end side is then screwed so as to fasten the entirety thereof; however, upon this screwing, the rotating force (rotary torque) of the screw is applied to the metal plate, thereby causing the metal plate to be slightly rotated relative to a normal (ideal) position. Consequently, the flexible substrate that is held and fixed to be bonded with the metal plate is also caused to be in a state with distortion (stress) applied due to the influence of the rotation; and, also, the ends of the flexible substrate connected with the driving circuit side and the PDP side are, for example, slightly-obliquely inserted to connectors or the like and caused to be in a poorly-connected state. Upon screwing at the two locations of the metal plate, if an operation of temporarily fixing one of the ends before fixing is added, the influence of the rotation is slightly mitigated; however, the work man-hours are increased. In this manner, excess stress is applied particularly to the flexible substrate of the driver module and the connecting ends thereof, which may lead to deterioration or damage of the parts, quality deterioration in terms of performance, etc.

Further, the second configuration of the conventional driver module has, firstly, a problem similar to that of the case of the first configuration in which excess stress is applied, for example, when the flexible substrate is inclined, since there is a vertical interval between the screw part of one side and the positioning pin of the other side relative to the chassis surface. Particularly, when the stress is increased due to, for example, the inclined flexible substrate, disconnection of the wiring pattern on the flexible substrate may be caused. Moreover, secondly, there is a problem that it is disadvantageous in terms of the holding and fixing balance, heat dissipation performance, grounding performance, etc. since the fastening force (holding and fixing force) of one of the sides using the positioning pin is smaller than that of the other screwing side.

The present invention takes into account the foregoing problems. It is an object of the present invention to provide, particularly in relation to the configuration of a driver module in a PDP apparatus, a technique which can realize quality improvement by realizing, for example, reduction in required parts such as screws, reduction in the work man-hours of attachment upon manufacturing and the like, and ensuring stable holding and fixing performance, dissipation performance, and grounding performance.

The typical ones of the inventions disclosed in this application will be briefly described as follows. In order to accomplish the above described object, the present invention provides a technique of a PDP apparatus having a PDP in which an electrode group is formed, a chassis structure to which the PDP is fixed and in which a circuit part for driving the PDP is disposed and configured, and a plurality of driver modules which electrically connect the electrode side of the PDP to the circuit part side of the chassis, characterized by having technical means or structures described as follows.

The driver modules are formed separately in plural groups corresponding to the PDP electrode groups, and the driver modules and, particularly, the substrates thereof are adjacently disposed in the region in the vicinity of the peripheral part of the chassis structure. The driver module comprises, for example, a flexible substrate on which wiring of connection, an IC for drive, etc. are mounted and a substrate (driver substrate) made of a metal plate which is a member for holding/fixing thereof, heat dissipation, etc. One of the ends of the flexible substrate of the driver module is connected with a circuit of the chassis side by a connector or the like, and the other end is connected with electrode ends of the PDP side by thermocompression bonding or the like, so that the flexible substrate surface is held/fixed in a curved state. A spatial region is provided between the chassis and the flexible substrate and the IC, and the substrate is connected and held/fixed to the chassis structure. As the driver module, particularly, an address driving module which connects an address driving circuit to address electrodes is provided.

(1) In the present PDP apparatus, as a structure which attaches and holds/fixes the plurality of adjacent driver modules to an attachment part of the chassis structure side, a structure in which each driver module is attached (or connected) to a metal plate by a means such as screwing in, for example, the vicinities of both ends thereof is provided, and the structure is devised. The attachment part of the chassis structure side with the metal plate side of the driver module is, particularly, in the vicinity of both ends of metal plates, and the part where metal plates are adjacent to each other or a boundary part. Typically, it is similarly formed in each adjacent part of the plurality of driver modules.

The present apparatus has a structure in which, as a first means, common fastening (common tightening) is performed by screwing or the like in the part where the driver modules and the substrates are adjacent to each other. The adjacent substrates are commonly fastened to each other by using screwing respectively by at least two parts in total for fastening commonly (common fastening parts) in the attachment part and the part where both ends of the substrates are adjacent to each other.

In addition to the structure of the first means, as a second means, as a part (positioning part) for positioning the metal plate, a structure which performs positioning by, for example, a protrusion, and a receiving part thereof is used in combination. The substrate and the flexible substrate are positioned by at least two positioning parts in total in the attachment part and the substrates.

In the case of the configuration using the first and the second means in combination, with respect to two adjacent substrates, in one of the adjacent parts thereof, the driver modules including the substrates are connected and held/fixed to the chassis structure by common fastening by one screwing or the like and positioning at two locations in total in the vicinities of both ends of the substrate.

Upon apparatus manufacturing and the like, the operation and the like of attaching the driver modules will be as the following. First, the driver module is formed when the substrate surface is bonded with the region of the flexible substrate corresponding to the IC-mounting surface by an adhesive or the like. Ends of the flexible substrate of the driver module are connected to the PDP electrode end and the end of the chassis side circuit part, respectively, so that the surface of the flexible substrate is in a curved state. In this state, for one driver module, when two protrusions in total of positioning parts in the attachment parts of the chassis structure side are inserted/fitted respectively in two receiving portions (elongated holes) in total in the vicinities of both ends of one substrate, the substrate and the flexible substrate are positioned at a predetermined normal (ideal) position. The adjacent plural driver modules are similarly positioned. Then, with respect to the attachment part in the chassis structure side, common fastening is made by screwing or the like in each of the part where the substrates are adjacent to each other.

As described above, since the structure requires the common fastening by at least one screwing or the like in the adjacent part of the driver modules, the number of required screw parts, etc., work man-hours, and the troublesomeness are reduced than conventional techniques. Moreover, by virtue of the combination use of the common fastening and positioning, stable holding/fixing performance, etc. of the metal plate and the flexible substrate can be realized.

In the attachment and holding/fixing of the driver modules, in the configuration of the first means using the normal screw part for common fastening, the force due to rotation of the screw is applied to the metal plate, etc. however, by virtue of the action of the positioning parts of the second means, the metal plate can be prevented from being rotated, and the driver modules are held/fixed in the state in which the stress to the flexible substrates is minimum. In other words, the influence of the force of the rotation is cancelled or mitigated by the positioning by the at least two positioning parts for one metal plate.

(2) In addition, as another configuration of the present apparatus, a configuration using a latch-equipped pin (latch-pin) is provided as a third means other than that using the normal screw part in the common fastening part of the first means in above-described (1). More specifically, it is a structure in which the latch-pin is inserted, for example, in the direction perpendicular to the chassis surface, at the position of the common fastening part of the adjacent part of the driver modules and the substrates and at the position of the attachment part corresponding to the chassis structure side, so that the substrates are held/fixed to the chassis structure by a latching action.

In the case of the configuration using the latch-pin, the rotation force due to a normal screw part is not applied, therefore, the driver module is held/fixed in the state in which the influence to the substrates and the stress to the flexible substrates are reduced as much as possible. In addition, since the holding/fixing can be done by inserting the latch-pin, the attachment operation of the driver modules is further facilitated.

(3) In addition, as another configuration of the present apparatus, in a configuration provided as a fourth means, at the attachment parts, the individual parts (metal plate connecting members) which connect the part of attachment of the substrate side to the corresponding attachment part of the chassis (main body) surface are provided as a part or extension of the chassis structure, so that ventilatable spatial regions are provided between the attachment part of the generally-flat chassis (main body) surface and the positions where the substrates of the driver modules are attached and held/fixed thereto. By virtue of the configuration described above, in the state in which the driver modules are held/fixed, efficient heat dissipation can be carried out by the ventilation in the spatial regions.

The effects obtained by typical aspects of the present invention will be briefly described below. According to the present invention, particularly in relation to the configuration of the driver modules in a PDP apparatus, reduction in required parts such as screws, reduction in operation man-hours of attachment upon, for example, manufacturing, ensuring heat dissipation performance, grounding performance, etc. are realized, thereby realizing quality improvement.

BRIEF DESCRIPTIONS OF THE DRAWINGS

Figure 10:
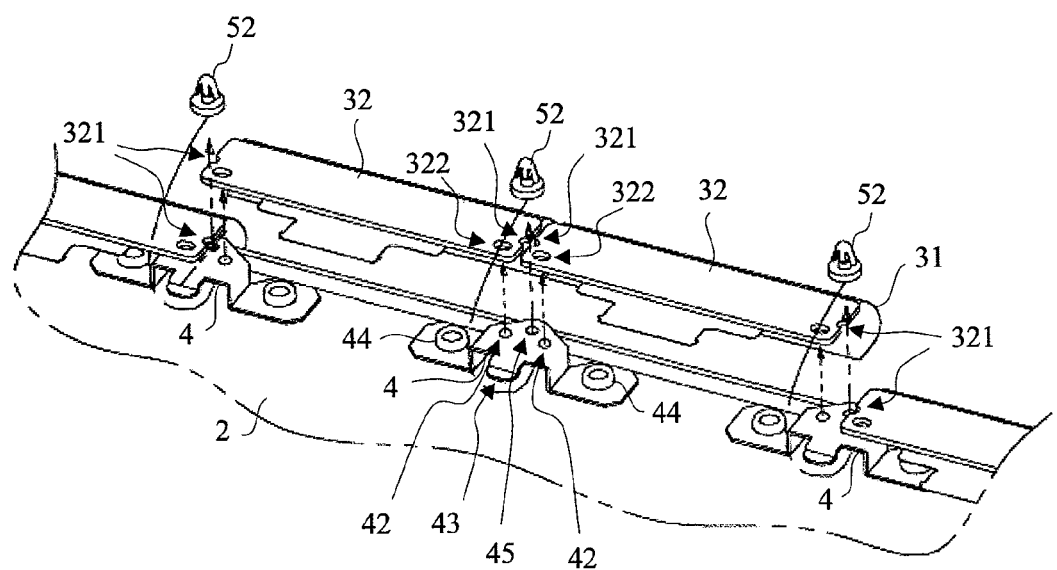
Figure 11:
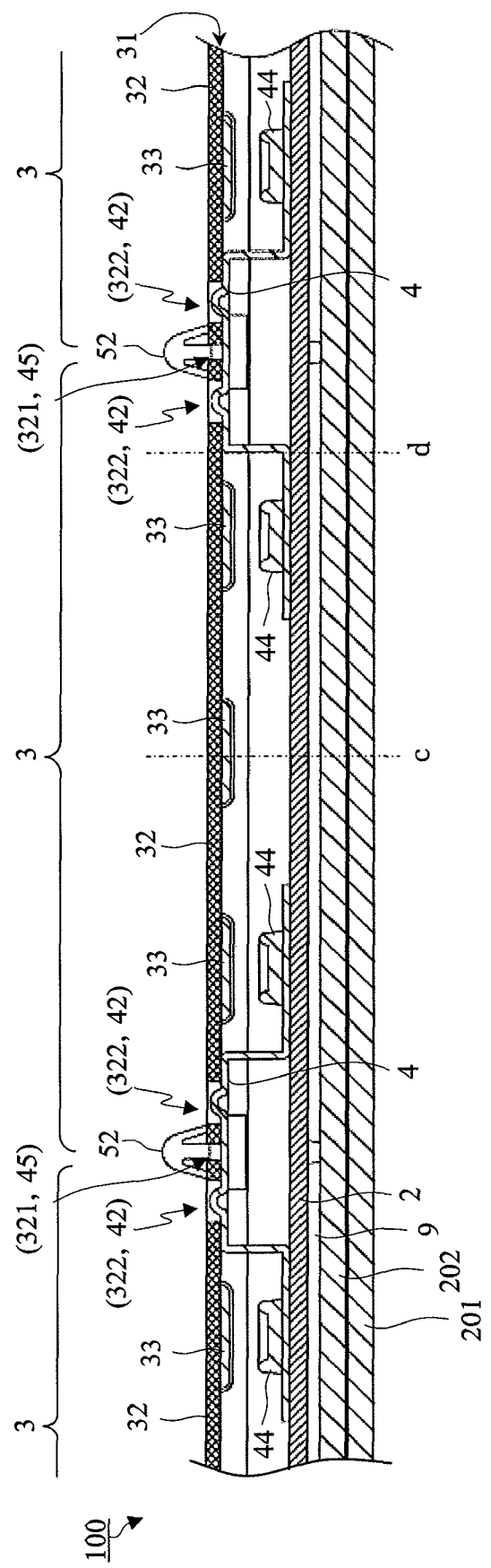

FIG. 10 is a perspective view showing a state before attachment as a configuration of the attachment of the ADM to the chassis structure in the PDP apparatus of the second embodiment of the present invention; and FIG. 11 is a drawing showing a cross sectional configuration at the center position of positioning pins in the direction of the row of the PDP display area (first direction) as a configuration in the vicinity of the attachment part of the ADM in the PDP apparatus in the second embodiment of the present invention.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
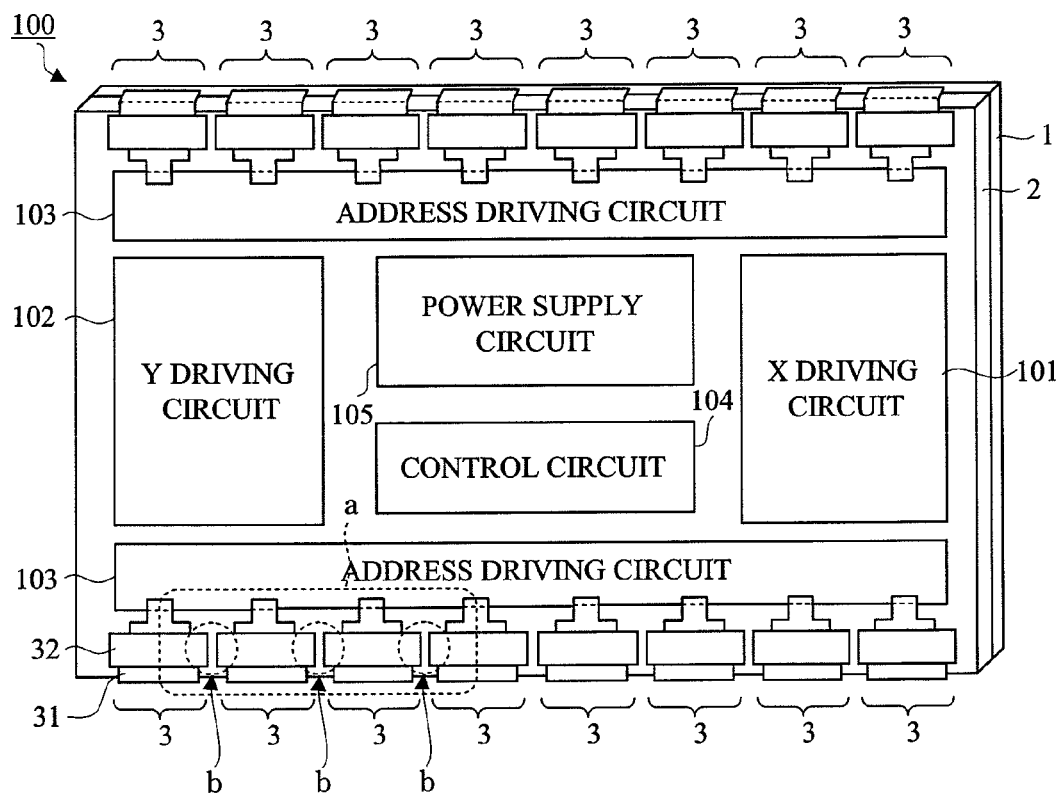
FIG. 1 is a drawing showing the schematic configuration of an entire PDP apparatus (PDP module) in a first embodiment of the present invention, particularly, showing an arrangement configuration of driving circuits, driver modules, etc. viewed from the rear side of the PDP module.
Figure 2:
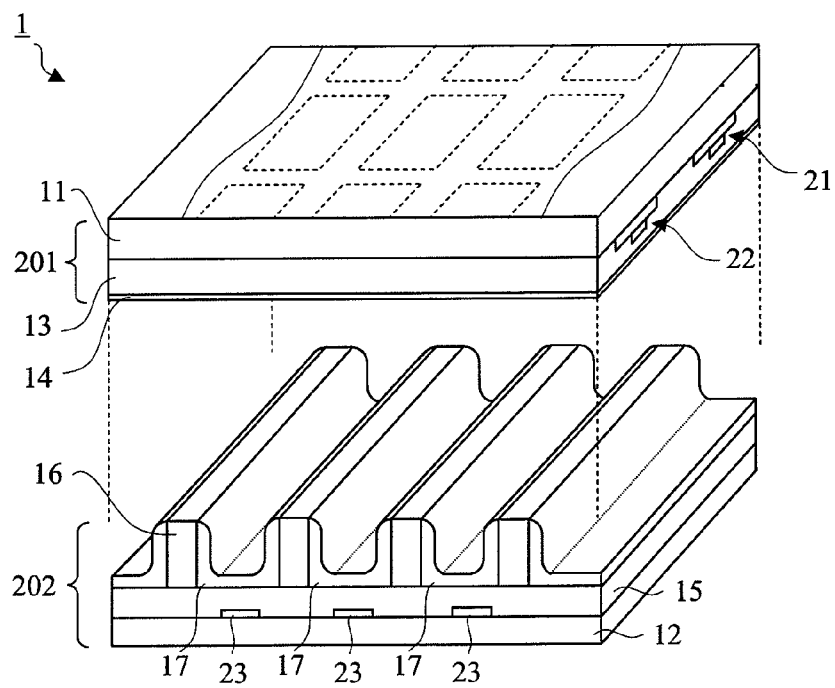
FIG. 2 is a drawing showing an exploded perspective view of a configuration as an example of the structure of a PDP in the PDP apparatus of the first embodiment of the present invention.
Figure 3:
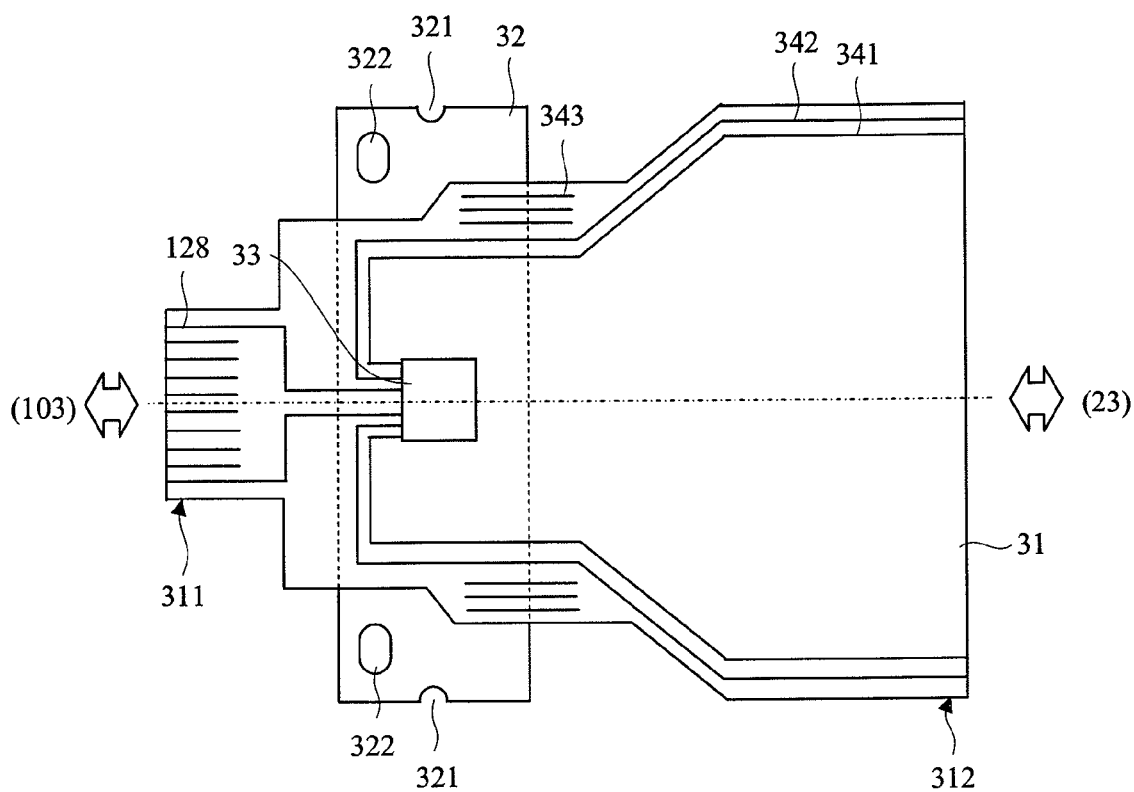
FIG. 3 is a drawing showing a planar configuration of an address driving module (ADM) in the PDP apparatus of the first embodiment of the present invention.
Figure 4:
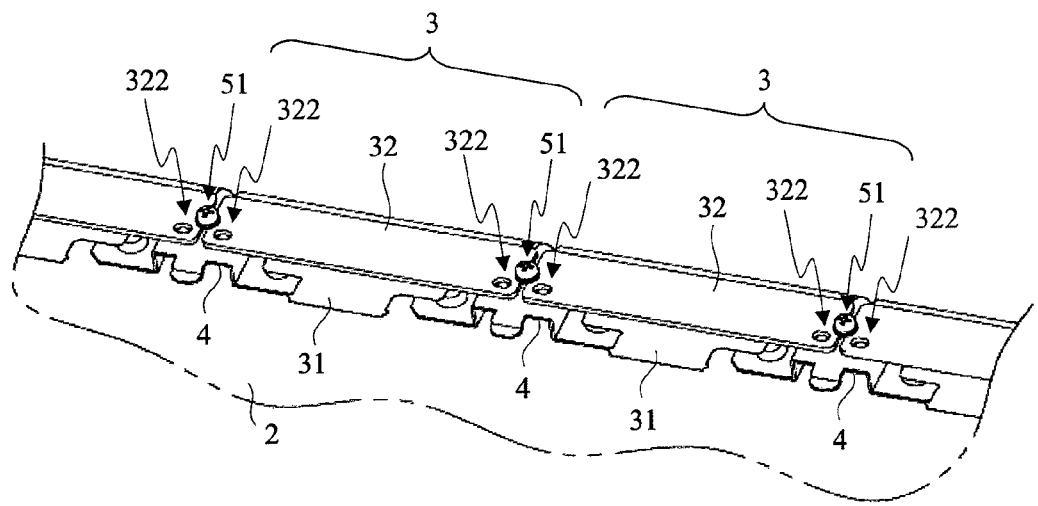
FIG. 4 is a perspective view showing a state after attachment of the ADM to a chassis structure as a configuration of the attachment thereof in the PDP apparatus of the first embodiment of the present invention.
Figure 5:
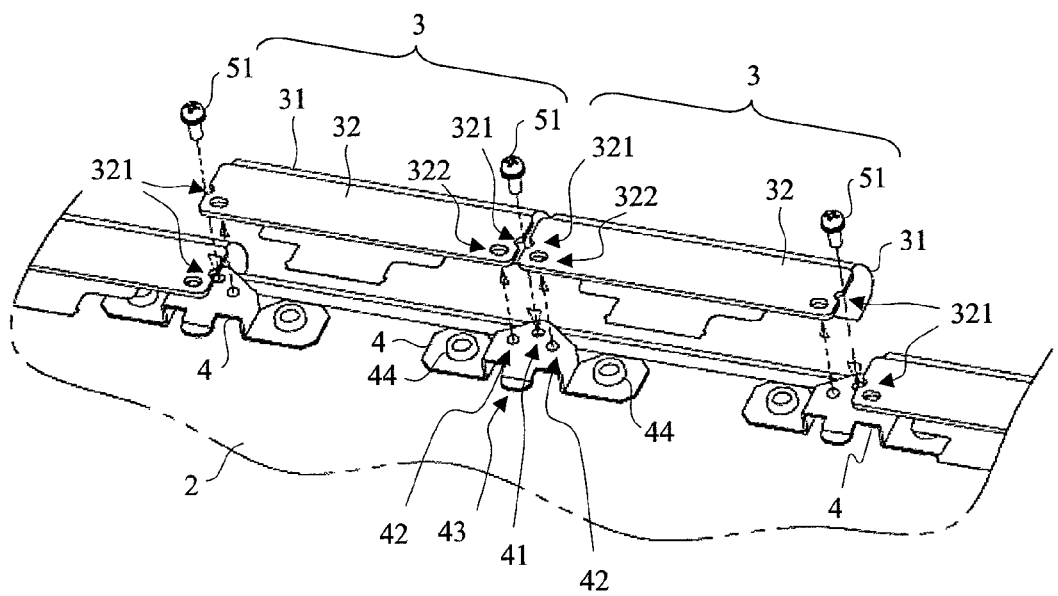
FIG. 5 is a perspective view showing a state before attachment of the ADM to a chassis structure as a configuration of the attachment thereof in the PDP apparatus of the first embodiment of the present invention.
Figure 6:
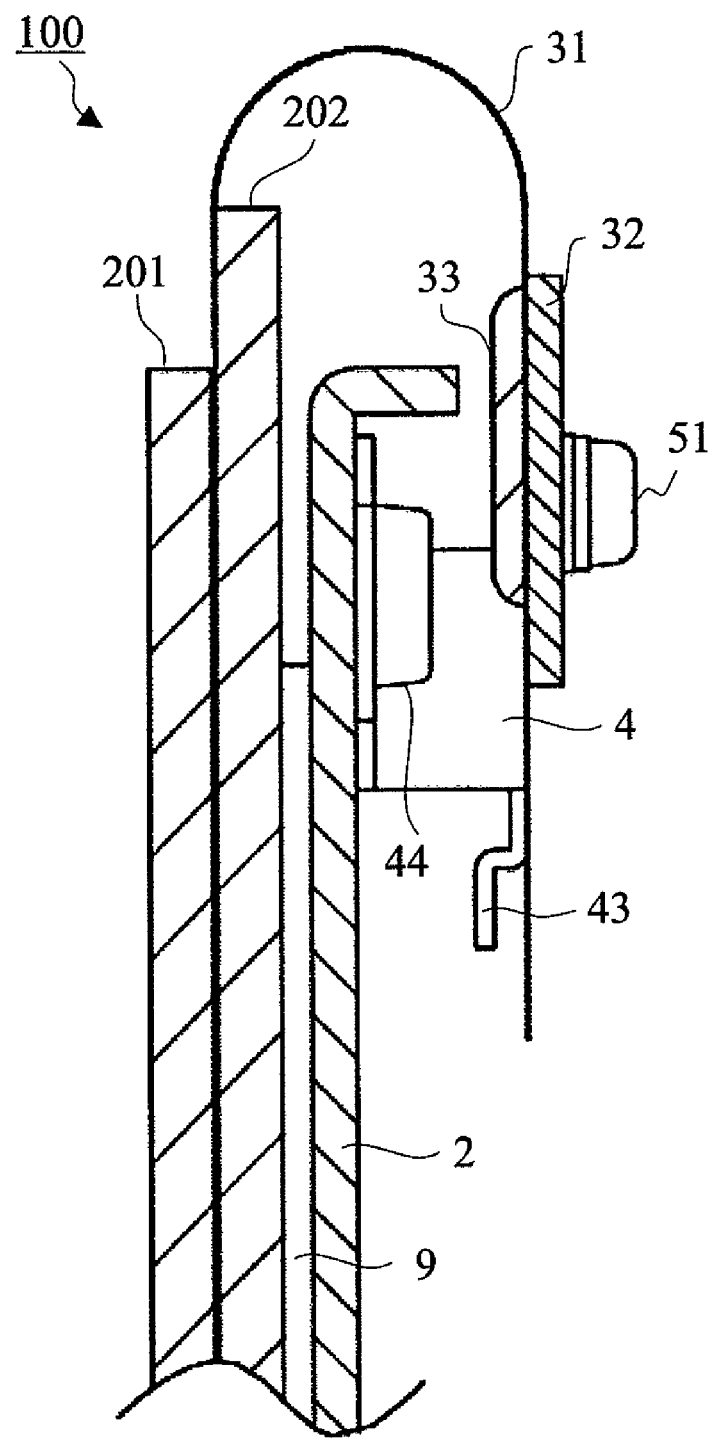
FIG. 6 is a drawing showing a cross sectional configuration at the center position of a driver IC in the direction of the column of the PDP display area (second direction) as a configuration in the vicinity of the attachment part of the ADM in the PDP apparatus of the first embodiment of the present invention.
Figure 7:
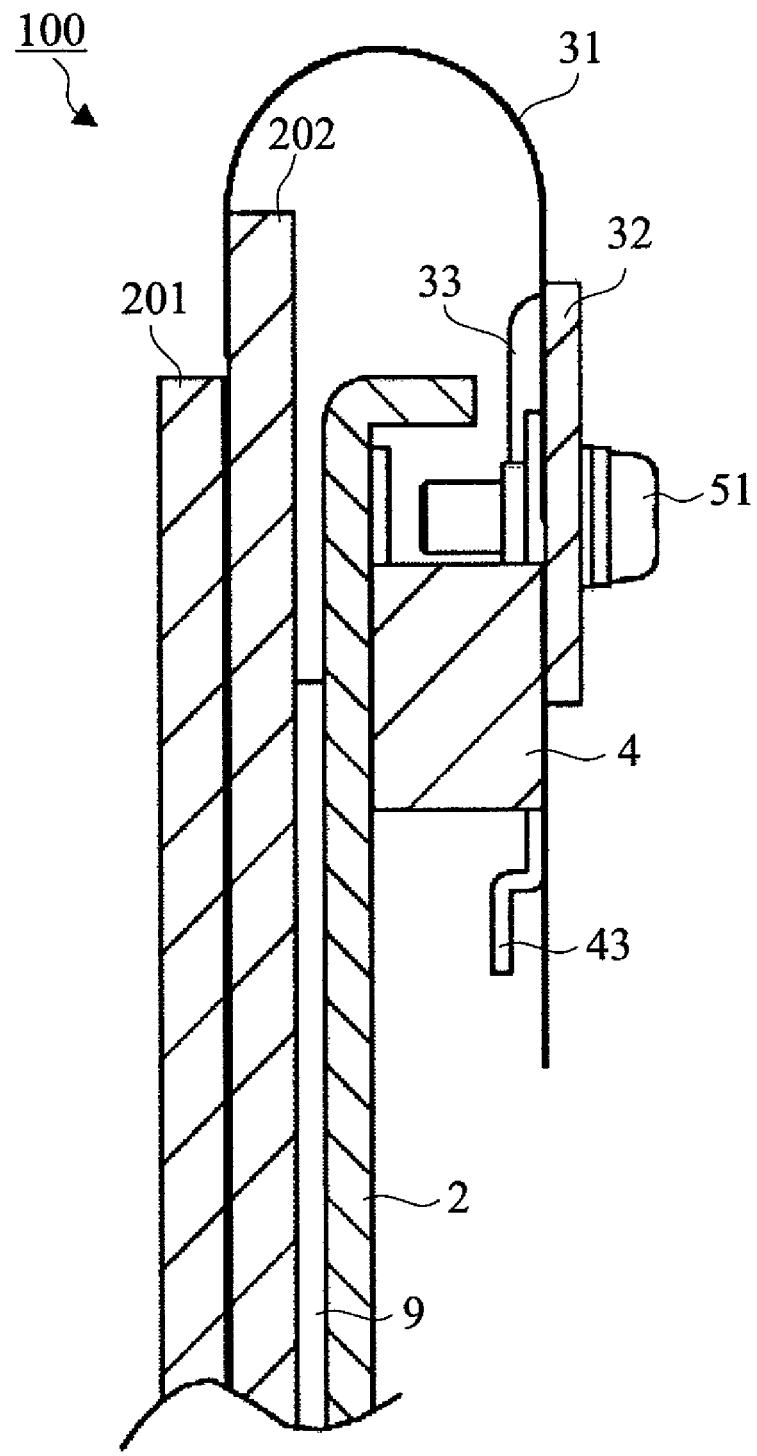
FIG. 7 is a drawing showing a cross sectional configuration at the center position of an upright wall of a bracket in the direction of the column of the PDP display area (second direction) as a configuration in the vicinity of the attachment part of the ADM in the PDP apparatus of the first embodiment of the present invention.
Figure 8:
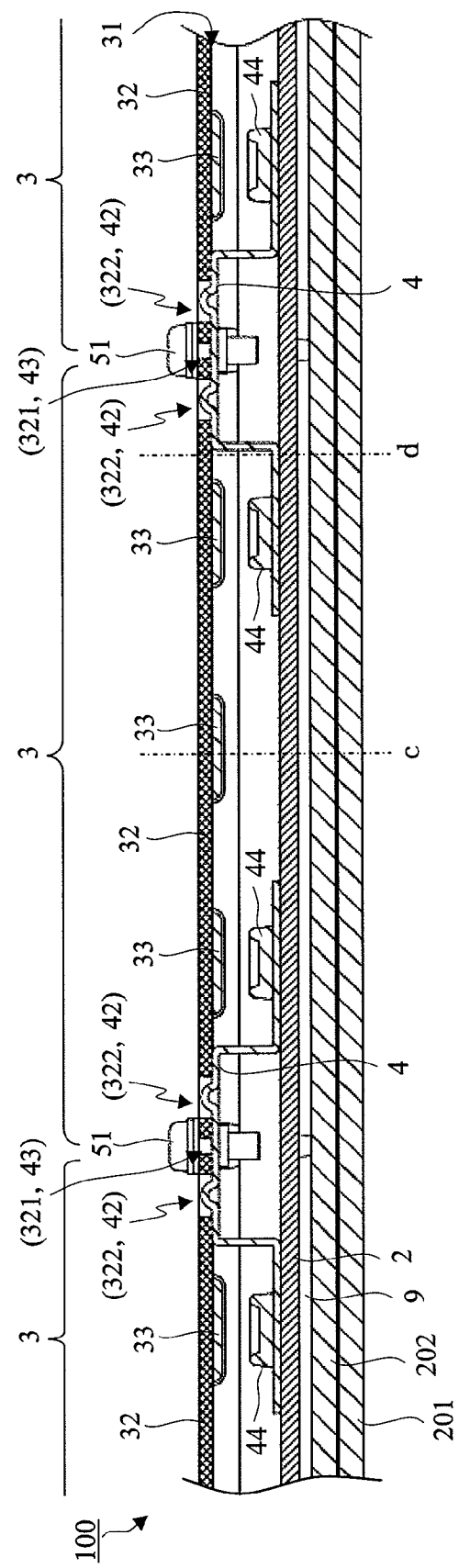
FIG. 8 is a drawing showing a cross sectional configuration at the center position of positioning pins in the direction of the row of the PDP display area (first direction) as a configuration in the vicinity of the attachment part of the ADM in the PDP apparatus of the first embodiment of the present invention.

A first embodiment of the present invention will be described with reference to FIG. 1 to FIG. 8. FIG. 1 shows a schematic configuration of an entire PDP module 100 which is a PDP apparatus. Particularly, a design configuration of driving circuits, etc. viewed from the rear side of the PDP module 100 is shown. FIG. 2 shows an example of the structure of a PDP 1. FIG. 3 shows a planar configuration example of an ADM 3. FIG. 4 and FIG. 5 show configurations of the attachment of the ADM 3. FIG. 6 to FIG. 8 show cross sectional configurations in the vicinity of an attachment part of the ADM 3.

Characteristic parts of the first embodiment are the structures of the ADM 3 and the vicinity of the attachment part thereof. In the structures, adjacent ADMs 3 are positioned by positioning pins and commonly fastened by screwing. The parts different from conventional techniques are, particularly, an address substrate 32, a bracket 4, etc.

<PDP Module>

In FIG. 1, the PDP module 100 mainly has the PDP 1 which is a front-side display unit and a rear-side chassis (base chassis) 2 holding the PDP 1, and the module has a configuration having address driving modules (abbreviated as ADMs) 3 which are driver modules connecting address electrode groups of the PDP 1 side with driving circuits of the chassis 2 side.

The PDP module 100 is formed when the PDP 1 is pasted and fixed onto the chassis 2 via an adhesive layer (for example, two-sided tapes separated in a plurality of regions), and parts such as the ADMs 3 are attached and connected. When the PDP module 100 is further incorporated in an outside case or the like, a PDP apparatus (product set) is formed.

The PDP 1 and the chassis 2 are generally rectangular flat-plate like structures. On a side of the chassis 2 (rear side), a circuit part (driving circuits) is formed according to a predetermined structure. The circuit part has an X (sustain) driving circuit 101, a Y (scan) driving circuit 102, first and second address driving circuits 103, a control circuit 104, a power supply circuit 105, etc.

The power supply circuit 105 feeds power to the circuits. The control circuit 104 is a circuit that controls the entirety of the PDP apparatus, is connected to each of the driving circuits {101, 102, and 103}, and generates and outputs control signals of drive based on display signals and control clock signals. Each of the driving circuits {101, 102, and 103} is electrically connected to an electrode group of a corresponding type in the PDP 1 side. The X driving circuit 101 applies drive voltages to X electrodes 21. The Y driving circuit 102 applies drive voltages to Y electrodes 22. The address driving circuits 103 apply drive voltages to address electrodes 23.

On the surface of the chassis 2, the address substrates 32 of the ADMs 3 are connected by the structures of predetermined attachment parts (b) so that the ADMs 3 are held and fixed. The attachment positions of the ADMs 3 are roughly in the regions of the upper and lower long sides of the chassis 2. In the region between that region and the address driving circuit 103, the plurality of ADMs 3 are aligned and disposed. The plurality of ADMs 3 are connected to each of the first and second address driving circuits 103, and they are connected to groups of the address electrodes 23 of the PDP 1 via the ADMs 3. In the present example, eight ADMs 3 are disposed in each of the upper and lower sides so that 16 ADMs are disposed in total.

The region indicated by 'a' is an example of the position of attachment of a plurality of the adjacent ADMs 3, and details thereof are shown in FIG. 4, etc. The regions other than 'a' also has similar configurations. Particularly, the region indicated by 'b' in 'a' shows the position of the attachment part (corresponding to the bracket 4) where the chassis 2 and the ADMs 3 are physically connected to each other.

Note that, the ADMs 3, the address substrates (metal plates) 32 thereof, etc. are different from the substrates of the address driving circuits 103 which is the source to which the plurality of ADMs 3 are connected. Further, the upper and lower two address driving circuits 103 correspond to the configuration that drives and controls the group of the address electrodes 23 of the display area of the PDP 1 dividing into two groups. The configuration is not limited thereto, and, for example, a configuration of a single address driving circuit may be employed. Although it is not shown, the X and Y driving circuits (101, 102) are connected to the corresponding X and Y electrode (21, 22) side of the PDP 1 via flexible substrates, etc. A characteristic configuration similar to that of the ADM 3 can be applied thereto when a configuration in which they are connected to the corresponding X and Y electrode (21, 22) groups of the PDP 1 via driver modules is presupposed.

The address driving circuit 103 is a circuit substrate which transmits drive control signals based on signals generated by the control circuit 104 to each of the ADMs 3. Parts on the address driving circuit 103 are circuits which are mainly for stabilizing operations. The groups of the address electrodes 23 of the PDP 1 are directly and individually driven from the ADMs 3 disposed corresponding to the groups of the address electrodes 23, and by driver ICs 33 mounted on flexible substrates 31 thereof. In each of the ADMs 3, by the driver IC 33, in accordance with drive control signals from the address driving circuit 103, driving for causing a display cell group of the PDP 1 to emit light (lighting), particularly, driving of an address electrode group (address driving) is performed. More specifically, the driver IC 33 generates drive signals (voltage waveforms) for driving the corresponding address electrodes 23 of the PDP 1 and applies them to target address electrodes 23 via interconnects (address driving). In the address driving, discharge for selection of lighting display cells is caused by voltage application to target address electrodes 23 and Y electrodes 22.

<PDP>

In FIG. 2, a structure example of the PDP 1 is described. The PDP 1 is formed by pasting a member of a front plate 11 side which is mainly made of glass (front member 20) with a member of a rear plate 12 side (rear member 202).

In the front plate 11 of the front member 201, the plurality of X (sustain) electrodes 21 and Y (scan) electrodes 22 for, e.g., repetitive (sustain) discharges of display are alternately disposed generally in parallel in a first (lateral) direction. The group of the X and Y electrodes (21, 22) which are display electrodes are covered by a first dielectric layer 13, and the surface of the first dielectric layer 13 is further covered by a protective layer 14 of, for example, MgO. Each of the X and Y electrodes (21, 22) is formed by, for example, a linear bus electrode made of metal and a transparent electrode electrically connected thereto for causing discharge.

On the rear plate 12 of the rear member 202, the plurality of address electrodes 23 are disposed generally in parallel in a second (vertical) direction generally perpendicular to the X and Y electrodes (21, 22), and the address electrodes 23 are further covered by a second dielectric layer 15. On both sides of the address electrode 23, barrier ribs 16 extending in the second direction are disposed so as to divide the display area of the PDP 1 in the column direction and into display cells. Furthermore, on the surface of the dielectric layer 15 on the address electrodes 23 and on the side surfaces of the barrier ribs 16, phosphors 17 of corresponding colors which generate visible light of red (R), green (G), and blue (B) when excited by ultraviolet rays are separately applied. A display line (row) is formed by a pair of the X and Y electrodes (21, 22), and a display cell is formed corresponding to the region divided by the barrier ribs 16 where the display line intersects with the address electrode 23. The display area of the PDP 1 is formed by a matrix of the display cells.

The PDP 1 is formed when the front plate 11 side and the rear plate 12 side are pasted to each other so that the protective layer 14 is brought into contact with the upper surface part of the barrier ribs 16, and a discharge gas such as Ne or Xe is sealed therein. The electrode groups of the PDP 1 are extended to the vicinities of the PDP 1, which are outside the sealing region, and connected to the driving circuit side of the rear of the chassis 2 via the flexible substrates of the driver modules, etc.

<ADM>

In FIG. 3, a configuration example of the ADM 3 is described. In FIG. 3, it is viewed from the side in which the driver IC 33 which is at the inside of the ADM 3. The ADM 3 is mainly formed by the flexible substrate 31 and the address substrate (metal plate) 32. The driver IC 33 (IC package) is mounted on the flexible substrate 31. In FIG. 3, a configuration in which one driver IC 33 is mounted on one address substrate 32 is shown as an example. The address substrate 32 is connected and fixed to the brackets 4 of the attachment parts (b) by both the ends (shorter sides) thereof. The ADM 3 has a generally symmetrical constitution with respect to the center line in the extending direction of the flexible substrate 31 (second direction). Note that the detailed structure of the ADM 3 is according to the designing concept and specification of the PDP apparatus and not limited to the present example.

The flexible substrate 31 is electrically connected to the address electrodes 23 of the PDP 1 and the address driving circuits 103 by the ends (311, 312) thereof. One of the ends 311 is, for example, inserted into a connector of the address driving circuit 103. The other end 312 is connected to the extended ends of the address electrodes 23 of the rear member 202 by thermocompression bonding.

On the flexible substrate 31, various wiring (341, 342) connected to the driver IC 33, independent linear patterns 343, etc. are provided. At the outermost both ends of the flexible substrate 31 in the width direction thereof (first direction), a ground line 342 connected (grounded) to the ground of the ADM 3 is provided; and, inside thereof, a plurality of signal wires 341 connected to the address electrodes 23 of the PDP 1 side are provided (illustration of the details of the signal lines 341 is omitted). The number of the signal wires 341 of one ADM 3 is, for example, 64 or 128, although it depends on the type of the driver IC 33. In addition, in partial regions of the flexible substrate 31 in the vicinities of ends of the longer sides of the address substrate 32 and outside the ground line 342, the plurality of linear patterns 343 not connected to the electrodes of the PDP 1 are provided in an arrangement that they perpendicularly cross the end face of the address substrate 32. The linear patterns 343 reinforce the flexible substrate 31 and contribute to mitigating the stress applied in the direction in which the wirings (341, 342) of the flexible substrate 31 are aligned, thereby preventing metal fatigue, etc. of the wirings.

The address substrate 32 is a member having functions/roles of holding and fixing the ADMs 3, which are connected and fixed to the chassis 2 at the attachment parts (b), dissipation, and grounding, and the substrate is formed by a generally rectangular metal plate in this example. In this example, one ADM 3 is formed when the inside surface of the address substrate 32 opposed to the side of one of the chassis 2 surfaces is bonded and pasted, by an adhesive or the like, with the outside surface of a partial area of one side of the flexible substrate 31 in which the driver IC 33 is disposed.

In the address substrate 32, a generally semicircular chipped portion 321 constituting a part of a common fastening part is provided in each of the vicinities of the center of both shorter sides thereof which are the parts where the ADMs 3 and the address substrates 32 are mutually adjacent, and an elongated hole (positioning pin receiving portion) 322 which constitutes a part of the positioning part is provided in each of the vicinities of the inside of the both shorter sides and near the address driving circuit 103 side. The chipped portion 321 functions for common fastening in combination with the corresponding chipped portion 321 of the adjacent address substrate 32 and has a position and a shape corresponding to the structure of an individual screw part (male screw) 51 and a female screw 41 of the bracket 4 side. The elongated hole 322 has a shape which is elongated in the longitudinal direction (first direction) of the address substrate 32 and has a margin which takes positioning and misalignment into consideration. These portions (321, 322) are formed, for example, by processing a metal plate which is a material of the address substrate 32.

<ADM Attachment>

In FIG. 4 and FIG. 5, the structure of the attachment and holding/fixing of the ADM 3 are described. In FIG. 4 and FIG. 5, configurations of the above described part of 'a' of FIG. 1 obliquely viewed from the rear side of the chassis 2 are shown. These configurations also correspond to the cross sectional views of FIG. 6 to FIG. 8. The neighboring parts of the other plural ADMs 3 also have the similar configuration. Note that, illustration of the address driving circuit 103, etc. is omitted. FIG. 4 shows the state in which the plurality of ADMs 3 are attached and held/fixed to the brackets 4 of the attachment parts (b) of the chassis 2, and FIG. 5 shows the state in which, in an attachment operation of the ADMs 3 upon apparatus manufacturing or the like, as an example, two adjacent ADMs 3 are attached to the brackets 4 of the attachment parts (b) of the chassis 2.

In FIG. 4 and FIG. 5, one ADM 3 is connected to the two adjacent brackets 4. In this example, the bracket 4 has a bulged shape (step-like shape) produced by subjecting a rectangular metal plate to bending processing and has: a structure having a bonding connection surface (first surface) with the end surfaces of the address substrate 32; bonding connection surfaces (second surfaces) with the chassis 2; and upright wall surfaces (third surfaces) connecting both of the end surfaces of the address substrate 32 and the chassis 2. By virtue of the shape and disposition of the bracket 4, a space region is provided between the chassis 2 (main body) plane and the first surface, and ventilation in the second direction is particularly made effective.

Note that such configuration of the bracket 4 has not been present as conventional driver module attachment structures, and the direction of ventilation has not been in such direction (second direction). As a result, heat dissipation performance can be improved more than the conventional ones. The member of the bracket 4, etc. may be integrally formed as the chassis 2 structure.

In FIG. 4, at the vicinities of both ends of the address substrate 32, the address substrate 32 is positioned by positioning pins 42 and the elongated holes 322 which are positioning parts, and, at the neighboring parts at both ends of the address substrate 32, the adjacent address substrates 32 are commonly fastened by screwing respectively by the screw part (male screw) 51.

In FIG. 5, beforehand, in an assembly step or the like of the chassis 2, the brackets 4 are connected and fixed to predetermined positions of the generally flat plate-like chassis 2 (main body) by screwing or the like of screw parts 44.

In addition, particularly in this example, a projecting portion 43 for placing and holding the substrate of the address driving circuit 103 is provided in the flat plate part of the first surface of the bracket 4 at the inner lateral thereof; and, at the outer lateral thereof, a projecting portion corresponding to placement and common fastening of the address substrate 32 is provided.

In the projecting portion of the outer lateral of the flat plate of the first surface of the bracket 4, one female screw portion (screw hole) 41 corresponding to the common fastening part is formed on the center line of the first surface and the part where the ADMs 3 are neighboring each other. In addition, at left and right symmetrical positions of the center line on the flat plate of the first surface of the bracket 4, the positioning pins 42 having the same shape are provided.

Upon attachment of the two adjacent ADMs 3, the elongated holes 322 at both ends of one address substrate 32 are set respectively for the positioning pins 42 on the first flat plates of two adjacent brackets 4. When the positioning pins 42 are inserted and fitted in the elongated holes 322, the address substrate 32 is positioned. Each of the adjacent address substrates 32 is similarly positioned. Then, in the state in which once the plurality of address substrates 32 are positioned, the screw part (male screw) 51 is screwed from upper side to the position of the female screw part 41 of the flat plate of the first surface of the bracket 4 and the combination of the chipped portions 321 of the address substrates 32 in the part where the address substrates 32 are neighboring each other.

In the constitution of this example, one female screw portion 41 and two positioning pins 42 are integrally formed with one bracket 4. Thus, the number of parts is further reduced.

<Cross Section of PDP Module (1)>

FIG. 6 and FIG. 7 show cross sections in the second direction (column direction of the PDP display area) at long-side portions of the PDP module 100 in which the ADM 3 is disposed. Among them, FIG. 6 shows a cross section (corresponding to 'c' of FIG. 8) at a position where the driver IC 33 is disposed on the center line of the ADM 3, and FIG. 7 shows a cross section (corresponding to 'd' of FIG. 8) of the center of the position of the upright wall of the bracket 4 of the attachment part (b). The rear member 202 of the PDP 1 and the chassis 2 (main body) are pasted to each other by an adhesive layer 9 so that they are generally entirely fixed.

As shown in FIG. 6 and FIG. 7, the flexible substrate 31 of the ADM 3 is held and fixed in the state in which the surface of the flexible substrate 31 is curved by connection and fixing of the address substrate 32 with the bracket 4, wherein one of the ends thereof (311) is connected to the address driving circuit 103 side, which is not shown, and the other end (312) is connected to the address electrode 23 side of the PDP 1. At an end region of the rear plate 12 of the PDP 1, the end 312 of the flexible substrate 31 of the ADM 3 is connected by thermocompression bonding.

A spatial region is provided between a position corresponding to the disposition of the address substrate 32 of the flexible substrate 31 and the flat surface of the chassis 2 (main body). Note that the end of the chassis 2 has a structure which is perpendicularly bent for improving strength, and it does not contact with the ADM 3.

<Cross Section of PDP Module (2)>

FIG. 8 shows a cross section of a long-side portion of the PDP module 100, in which the ADMs 3 are disposed, in the first direction (row direction of the PDP display area), particularly, a cross section at a position of the positioning part (322, 42).

On the inner surface of the flexible substrate 31, at the position corresponding to disposition of the address substrate 32, one or more driver ICs 33 are mounted in an arrangement that they do not contact with the brackets 4 of the attachment parts (b) of the chassis 2 side. FIG. 8 shows, as an example, a configuration in which three driver ICs 33 are mounted on one ADM 3. One of the driver ICs 33 is provided on the center line of the ADM 3, and the other two driver ICs 33 are provided on both sides thereof. For example, when three driver ICs 33 each of which having 128 lines are mounted on one ADM 3, 384 address electrodes 23 can be driven by the single ADM 3, and eight ADMs 3 can drive 3072 address electrodes 23 in total. Since one pixel is formed by a set of display cells of three colors, R, G, and B, the number of pixels of the display area of the PDP 1 in the row direction is 1024.

As shown in FIG. 8, both ends of two adjacent address substrates 32 are placed on the bulged planar portion (first surface) of one bracket 4. The positioning pins 42 of the planar portion (first surface) of the bracket 4 are inserted in the elongated holes 322 of the address substrate 32 side. In addition, they are commonly fastened by the female screw portion 41 of the planar portion (first surface) of the bracket 4, the combination of the chipped portions 321 of the adjacent address substrates, and the screw part (male screw) 51.

The shape of the positioning pin 42 is, for example, hemispherical; and, other than that, various shapes such as a rod-like shape may be used. The elongated hole 322 which is the receiving portion of the positioning pin 42 may be a shape other than a through hole. The positioning pin 42 may be formed to upwardly protrude through the elongated hole 322. The positioning pin 42 and the elongated hole 322 may be oppositely formed between the side of the chassis 2 with the bracket 4 and the side of the address substrate 32. They may have a structure integral with the address substrate 32 or the chassis 2 and the bracket 4, or may be formed to be connected and fixed as separate parts.

<Effects>

According to the constitution of the first embodiment, as advantageous points, sufficient fastening force can be ensured by screwing at two locations (common fastening parts) with respect to one ADM 3; and influence of the rotation force due to screwing imposed on the address substrate 32 and the stress imposed on the flexible substrate 31 can be reduced as much as possible by positioning at two positions (positioning parts) with respect to one ADM 3. Therefore, comprehensively, in the ADM 3 and the attachment part, stable performance of holding and fixing can be realized by reduced number of parts and work man-hours, and heat dissipation performance, grounding performance, etc. can be also ensured. Particularly, regarding the required number of the screw parts 51, in a case where eight ADMs 3 are to be attached, 16 screw parts which is twice the number has been required conventionally; however, in the case of the present configuration, the number is reduced to 9.

Other effects such as heat dissipation performance will be described. The PDP 1 to which the flexible substrates 31 of the ADMs 3 are connected generates heat through discharges. In addition, the driver ICs 33 mounted on the flexible substrates 31 also generate heat. The chassis 2, the address substrate 32, the bracket 4, etc. are made of heat-conductive materials, such as an aluminium alloy, in consideration of heat dissipating performance. The heat generated in, for example, the PDP 1, the circuit part, and the flexible substrates 31 is transmitted through the chassis 2, the brackets 4, and the metal plates 32 and dissipated. Particularly, the heat is transmitted and dissipated from the driver ICs 33 and the flexible substrates 31 to the address substrates 32, and from the address substrates 32 to the brackets 4. Since the spatial regions are present below the brackets 4, heat is efficiently dissipated by ventilation.

Further, the rates of thermal expansion are different between the PDP 1 made of glass and the chassis 2 and the address substrates 32 made of metal. Therefore, particularly, it is a problem that stress is applied in the direction in which the wirings of the flexible substrates 31 are aligned (first direction). Against this problem, metal fatigue and the like of the wirings are prevented by reinforcing the flexible substrates 31 (e.g., linear patterns 343) and the structure in the vicinity of the present characteristic attachment part (b) which mitigates the stress.

The elongated hole 322 provided in the address substrate 32 has a shape which is long in the width direction of the flexible substrate 31 (first direction) so as to leave a margin/gap. Therefore, in attachment of the address substrate 32 and the bracket 4 in the chassis 2 side, the attachment can be carried out in the form in which stress caused by misalignment or the like is not imposed on the flexible substrate 31, and the stress due to the difference between thermal expansion between the chassis 2 and the PDP 1 is mitigated.

Second Embodiment

Figure 9:
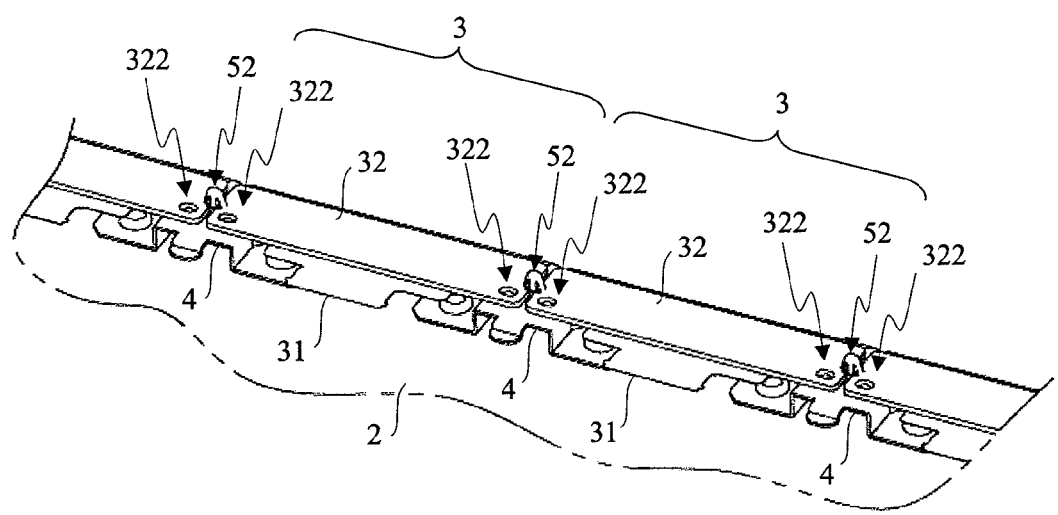
FIG. 9 is a perspective view showing a state after attachment of an ADM to the chassis structure as a configuration of the attachment thereof in a PDP apparatus of a second embodiment of the present invention.

Next, a second embodiment of the present invention will be described with reference to FIG. 9 to FIG. 11. FIG. 9 and FIG. 10 show configurations of attachment of the ADMs 3 in the PDP module 100. FIG. 11 shows a cross sectional configuration in the vicinity of the attachment part of the ADMs 3.

In the second embodiment, the entire configuration of the PDP module 100 and the configurations of ADM 3, etc. are similar to that of the first embodiment; and it is mainly different in the point that a latch-pin 52 is used as a part for attachment instead of the screw part 51.

In FIG. 9 and FIG. 10, the structure of the attachment and holding/fixing of the ADMs 3 are described. The configurations of FIG. 9 and FIG. 10 also correspond to the cross sectional view of FIG. 11. One ADM 3 is connected to two adjacent brackets 4. The bracket 4 has a structure generally same as that of the first embodiment, but, as a different part, has a hole 45 corresponding to insertion of the latch-pin 52 on the center line of the planar portion of the first surface.

In FIG. 9, at the vicinities of both ends of the address substrate 32, the address substrate 32 is positioned by the positioning pin 42 and the elongated hole 322 which are positioning parts; and, at both ends of the neighboring parts of the address substrate 32, the adjacent address substrates 32 are commonly fastened or commonly held and fixed, respectively, by the latching action by the latch-pins 52. The holding and fixing by the latch-pin 52 uses the force perpendicular to the surface of the chassis 2 and does not apply the rotating force to the address substrates 32.

In FIG. 10, in the bulged portion in the outer lateral of the flat plate of the first surface of the bracket 4, one hole 45 corresponding to the common fastening part is formed on the center line of the first surface and the part where the ADMs 3 are neighboring each other. The latch-pin 52 has a lower base portion, a shaft portion, and a latch part of which upper side is movable. The latch-pin 52 made of resin is suitable since it has a good slipping property.

Upon attachment of the two adjacent ADMs 3, the elongated holes 322 at both ends of one address substrate 32 are set respectively for the positioning pins 42 on the first flat plates of two adjacent brackets 4. When the positioning pins 42 are inserted and fitted in the elongated holes 322, the address substrate 32 is positioned. Each of the adjacent address substrates 32 is similarly positioned. Then, in the state in which once the plurality of address substrates 32 are positioned, the latch-pin 52 is inserted from lower side into the position of the hole 45 of the flat plate of the first surface of the bracket 4 and the combination of the chipped portions 321 of the address substrates 32 in the part where the address substrates 32 are neighboring each other. Upon the insertion, the movable latch part of the upper side of the latch-pin 52 is moved to the state in which it is narrowed corresponding to passage of the hole 45. When the latch part of the latch-pin 52 passes through the hole 45 in that state, the latch part returns to the original widened state. As a result, the ends of the address substrates 23 are sandwiched and held by the base portion and the latch part of the latch-pin 52, and the address substrate 32 is held and fixed with respect to the brackets 4.

The positioning pin 42 of the planar portion (first surface) of the bracket 4 is inserted in the elongated hole 322 in the address substrate 32 side. In addition, common fastening or common holding/fixing is made by the hole 45 of the planar portion (first surface) of the bracket 4, the combination of the chipped portions 321 of the adjacent address substrates 32, and the latch-pin 52. The ADM 3 is held and fixed by the positioning action of the two positioning parts and the latch action of the latch-pin 52 of one common fastening part with respect to one address substrate 32.

According to the second embodiment, as an advantageous point, the operation of attaching the ADM 3 is further facilitated since the latch-pin 52 is used and therefore rotating fastening like the screw part 51 is not required.

The present configuration is a configuration using the common fastening parts (321, 45) and the positioning parts (322, 42) in combination. Different from the screw part 51 of the first embodiment, the common fastening or common holding/fixing by the latch-pin 45 of the second embodiment does not apply the rotating force to the address substrates 32. Therefore, instead of the above described combination configuration, for example, a configuration in which holding and fixing is made mainly by the latch-pin 45 without providing the positioning parts (322, 42) can be employed.

As described above, according to the embodiments, in attachment and holding/fixing of the ADM 3, positioning can be carried out with high precision, particularly, influence of the rotation of the address substrate 32 is prevented so as to reduce the distortion stress of the flexible substrate 31 as much as possible, and the ADM 3 can be held and fixed stably and reliably. In addition, since the present configurations can be formed by comparatively plain and simple implementation configurations, reduction in the cost of the apparatus can be expected.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be utilized in a display apparatus, etc. which connects circuits of a chassis side with a display part side by using driver modules including flexible substrates.

What is claimed is:

1. A plasma display apparatus comprising: a plasma display panel in which an electrode group is formed; a chassis to which the plasma display panel is fixed and in which a circuit part for driving the plasma display panel is disposed and configured; and a plurality of driver modules which electrically connect the electrode side of the plasma display panel to the circuit part side of the chassis;

wherein the plurality of driver modules are adjacently disposed in the vicinity of the chassis;

the driver module has a flexible substrate on which wiring of the connection and an IC are mounted and a substrate bonded with a surface of the flexible substrate for holding/fixing the flexible substrate to the chassis and is disposed so that a spatial region is provided between the flexible substrate and the chassis, and the substrate is held/fixed to the chassis; and as a structure which attaches and holds/fixes the adjacent driver modules to an attachment part of the chassis, for each driver module, the substrate and the flexible substrate are positioned by at least two positioning parts in the attachment part and the substrate, and the adjacent substrates are commonly fastened to each other by respectively using screwing by at least two common fastening parts in the attachment part and a part where both ends of the substrates are neighboring each other.

2. The plasma display apparatus according to claim 1, wherein the substrate is a generally-rectangular metal plate having sides longer than the width of the flexible substrate;

in each of the short side parts at both ends of the substrate, a semi-circular chipped portion is provided corresponding to the position of fastening of a screw part of the common fastening part; and the attachment part of the chassis has a female screw portion corresponding to the position of fastening of the screw part of the common fastening part.

3. The plasma display apparatus according to claim 2, having elongated holes corresponding to the positioning parts respectively in the vicinities of inside of the short side parts at both ends of the substrate;

wherein the attachment part of the chassis has a protruding part at a position corresponding to the elongated hole of the positioning part.

4. The plasma display apparatus according to claim 1, having a structure of the attachment part, at a position above the main body of the chassis corresponding to the neighboring parts of the neighboring substrates of the adjacent driver modules, for placing and attaching each end of the substrate, wherein the attachment part has: a planar portion bulged with respect to the surface of the main body of the chassis; and, below the planar portion, a spatial region through which ventilation can be performed in the extending direction of the flexible substrate.

5. The plasma display apparatus according to claim 4,
wherein the attachment part is formed as a member made of metal attached to the main body of the chassis by screwing.

6. The plasma display apparatus according to claim 5,
wherein the member made of metal has a female screw portion in the bulged planar portion at a position corresponding to the chipped portions of the common fastening part and has protruding portions at positions corresponding to the elongated holes of the positioning parts.

7. The plasma display apparatus according to claim 1,
wherein the driver module is an address driving module connecting a group of address electrodes of the plasma display panel with an address driving circuit in the circuit part; and the plurality of address driving modules are aligned and disposed in the region in the vicinity of the chassis.

8. A plasma display apparatus comprising: a plasma display panel in which an electrode group is formed; a chassis to which the plasma display panel is fixed and in which a circuit part for driving the plasma display panel is disposed and configured; and a plurality of driver modules which electrically connect the electrode side of the plasma display panel to the circuit part side of the chassis;

wherein the plurality of driver modules are adjacently disposed in the vicinity of the chassis;

the driver module has a flexible substrate on which wiring of the connection and an IC are mounted and a substrate bonded with a surface of the flexible substrate for holding/fixing the flexible substrate to the chassis and is disposed so that a spatial region is provided between the flexible substrate and the chassis, and the substrate is held/fixed to the chassis; and as a structure which attaches and holds/fixes the adjacent driver modules to an attachment part of the chassis, for each driver module, the adjacent substrates are commonly held/fixed to each other by respectively using latch-pins by at least two common fastening parts in the attachment part and a part where both ends of the substrates are neighboring each other.

9. The plasma display apparatus according to claim 8,
wherein as a structure which attaches and holds/fixes the adjacent driver modules to an attachment part of the chassis, for each driver module,
the substrate and the flexible substrate are positioned by at least two positioning parts in the attachment part and in the vicinities of both ends of the substrate.

10. The plasma display apparatus according to claim 8,
wherein the substrate is a generally-rectangular metal plate having sides longer than the width of the flexible substrate;
in each of the short side parts at both ends of the substrate, a semi-circular chipped portion is provided corresponding to the position of fastening of a screw part of the common fastening part; and
the attachment part of the chassis has a hole corresponding to insertion of the latch-pin corresponding to the position of fastening of the screw part of the common fastening part.

* * * * *